United States Patent
Barnes

(10) Patent No.: US 7,831,945 B2
(45) Date of Patent: Nov. 9, 2010

(54) MANUFACTURING A CLOCK DISTRIBUTION NETWORK IN AN INTEGRATED CIRCUIT

(75) Inventor: Paul Barnes, Chepstow (GB)

(73) Assignee: STMicroelectronics (R&D) Ltd., Buckinghamshire (GB)

( * ) Notice: Subject to any disclaimer, the term of this patent is extended or adjusted under 35 U.S.C. 154(b) by 1159 days.

(21) Appl. No.: 11/372,235

(22) Filed: Mar. 9, 2006

(65) Prior Publication Data

US 2006/0248486 A1 Nov. 2, 2006

(30) Foreign Application Priority Data

Mar. 11, 2005 (EP) .................. 05251496

(51) Int. Cl.
  *G06F 17/50* (2006.01)
  *G06F 9/45* (2006.01)

(52) U.S. Cl. .............. 716/6; 716/2; 716/4; 716/5; 716/10; 716/17

(58) Field of Classification Search ............. 716/2, 716/4, 5, 6, 10, 17; 326/108
  See application file for complete search history.

(56) References Cited

U.S. PATENT DOCUMENTS

| | | | |
|---|---|---|---|
| 5,598,347 A | | 1/1997 | Iwasaki |
| 5,956,497 A * | | 9/1999 | Ratzel et al. .................. 716/1 |
| 6,163,174 A * | | 12/2000 | Friedman et al. ............. 326/108 |
| 6,370,662 B2 * | | 4/2002 | Hamidi ....................... 714/724 |
| 6,425,114 B1 * | | 7/2002 | Chan et al. ..................... 716/6 |
| 6,536,024 B1 | | 3/2003 | Hathaway |
| 6,591,407 B1 * | | 7/2003 | Kaufman et al. .............. 716/10 |
| 7,062,737 B2 * | | 6/2006 | Tetelbaum et al. ............. 716/6 |
| 7,222,311 B2 * | | 5/2007 | Kaufman et al. ............... 716/2 |
| 7,426,710 B2 * | | 9/2008 | Zhang et al. .................. 716/17 |
| 2003/0088842 A1 | | 5/2003 | Cirit |
| 2003/0163750 A1 * | | 8/2003 | Trivedi et al. ............... 713/503 |
| 2003/0208736 A1 | | 11/2003 | Teng et al. |

OTHER PUBLICATIONS

European Search Report from corresponding European Application No. 05251496, filed Mar. 11, 2005.
Kai Wang et al., *Potential Slack Budgeting with Clock Skew Optimization*, Computer Design: VLSI in Computers and Processors, 2004. ICCD 2004, Proceedings IEEE International Conference on San Jose, CA, Oct. 11-13, 2004, Piscataway, NJ, IEEE, Oct. 11, 2004, pp. 265-271 XP010736781.
Xi J G et al.: *Useful-Skew Clock Routing withjGate Sizing for Low Power Design*, Journal of VLSI Signal Porcessing Systems for Signal, Image, and Video Technology, Kluwer Acedemic Publishers, Dordrecht, NL, vol. 16, No. 2/3, Jun. 1997, pp. 163-179, XP000692608.

* cited by examiner

*Primary Examiner*—Helen Rossoshek
(74) *Attorney, Agent, or Firm*—Lisa K. Jorgenson; James H. Morris; Wolf, Greenfield & Sacks, P.C.

(57) ABSTRACT

A method of designing a clock distribution network in an integrated circuit, the method including: creating a clock distribution network with all cells having a maximum drive strength; supplying parameters of the clock distribution network to a timing analysis tool; in the timing analysis tool, analyzing the timing of the clock distribution network in an iterative process including manipulating the drive strength of at least one cell in the clock distribution network and assessing whether there is an improvement in the timing, wherein the iterative process ceases where there is no improvement in the timing; and outputting a list of cells for which the drive strength was changed.

26 Claims, 4 Drawing Sheets

MANUFACTURING A CLOCK DISTRIBUTION NETWORK IN AN INTEGRATED CIRCUIT

BACKGROUND OF THE INVENTION

1. Field of the Invention

The present invention relates to designing and manufacturing a clock distribution network in an integrated circuit.

2. Discussion of the Related Art

In high speed digital design, distributing and managing a system clock presents real challenges. The term "clock skew" is used to denote the tolerance or uncertainty in the arrival time of the active clock edge at state devices due to variation in the propagation delay in the paths of the clock distribution network. Tiny differences in propagation delay over clock traces in a complex digital product often lead to unacceptable degradations in overall system timing margins. This is controlled in current systems using clock drivers or buffers (referred to herein as clock tree cells) which provide one common clock input and a plurality of ganged outputs, These clock tree cells are arranged in a "tree" clock distribution topology, where each cell feeds cells at the next level of the tree or a set of loads at the end of the tree. Loads can be registers implemented as flip-flops (herein flops) or gates. To minimize skew-related issues, delays of all clock traces should be balanced. In system-on-chip (SOC) designs using multi-level clock trees, the worst case skew needs to be controlled between any of the branch nodes. Wherever the path between two branch nodes traverses a clock tree cell input, the input-to-output skew specification for that cell enters the overall skew equation for the chip. The concept of active use of clock skew, or useful skew, has been used to allow overall timing on the chip to be controlled by appropriately selecting clock tree cells, for example to maximize performance of the system or assist in timing closure. For example, where a flop driven by a clock has tight timing to one side and relaxed timing on the other, a tool can try to move the clock edge toward the relaxed side by altering the size of clock tree cells and changing clock branching points. However, it can be a complex issue to optimize system behavior by adjusting skew behavior due to the limitation of existing tools.

One existing technique for using active clock skew is integrated with a clock tree synthesis (CTS) tool. That is, as the clock tree is synthesized, the drive strength of clock tree cells and the location of branch points are adjusted to improve the overall timing of the integrated circuit. However, because the technique is applied before the detailed routing of the design is established, the results can be sub-optimal.

Another technique is to manually adjust clock skew after routing of the design has been completed. This has the advantage that it is based on accurate data from the integrated circuit because it uses the results of a timing analysis tool including parasitic data. However, it is a manually intensive process. Moreover, changes which would require clock tree cells to be upsized may not be possible without disturbing other circuits within the integrated circuit.

SUMMARY OF THE INVENTION

According to one aspect of the present invention there is provided a method of designing a clock distribution network in an integrated circuit, the method comprising: creating a clock distribution network with all cells having a maximum drive strength; supplying parameters of the clock distribution network to a timing analysis tool; in the timing analysis tool, analyzing the timing of the clock distribution network in an iterative process including manipulating the drive strength of at least one cell in the clock distribution network and assessing whether there is an improvement in the timing, wherein the interactive process ceases where there is no improvement in the timing; and outputting a list of cells for which the drive strength was changed.

Where the footprint of a cell increases with its drive strength, it can be useful to first reduce the drive strength of the cells to an intermediate drive strength. This step can be carried out in the timing analysis tool.

Another aspect provides a timing analysis tool for analyzing a clock distribution network of an integrated circuit, the tool comprising program code means which when executed in a computer carries out: analyzing the timing of the clock distribution network in an iterative process including manipulating the drive strength of at least one cell in a clock distribution network and assessing whether there is an improvement in the timing, wherein the iterative process ceases when there is no improvement in the timing; and outputting a list of cells for which the drive strength was changed.

A further aspect provides a method of manufacturing an integrated circuit using the design method hereinabove defined and using the list of cells in the manufacturing process of the integrated circuit.

A further aspect of the invention provides an integrated circuit when manufactured by this method.

A further aspect of the invention provides a computer system for designing a clock distribution network in an integrated circuit, the computer system comprising: a database holding data defining a clock distribution network with all cells in the network having a maximum drive strength; a processor adapted to execute a timing analysis tool which, when executed, analyses the timing of the clock distribution network in an iterative process including manipulating the drive strength of at least one cell in the clock distribution network and assessing whether there is an improvement in the timing, the iterative process ceasing when there is no improvement in the timing; and a storage device for holding a list of cells output from the timing analysis tool for which the drive strength was changed.

BRIEF DESCRIPTION OF THE DRAWINGS

For a better understanding of the present invention and to show how the same may be carried into effect, reference will now be made to the accompanying drawings, in which.

DETAILED DESCRIPTION

Figure 1:
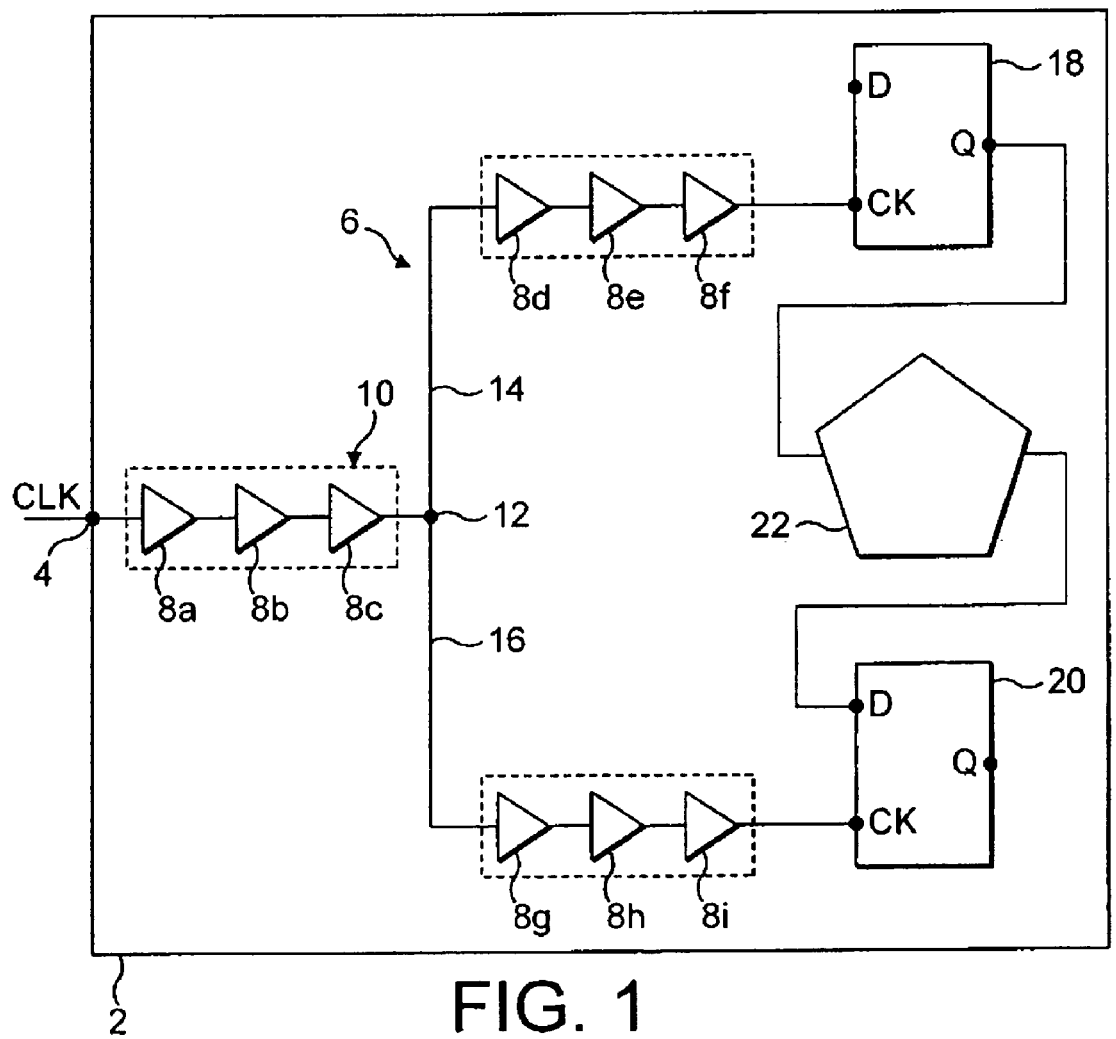
FIG. 1 is a schematic diagram showing relevant components of an integrated circuit.

FIG. 1 illustrates an integrated circuit 2 having a clock input 4 which receives a clock signal CLK. A clock distribution network 6 comprises a set of clock traces or paths, each path including one or more clock tree cells 8. In FIG. 1, a common clock path 10 is shown including cells 8a, 8b, 8c. A common clock path 10 branches at a branch node 12 into clock branch paths 14, 16. The clock branch path 14 is shown including clock tree cells 8d, 8e, 8f and the clock tree path 16 is shown including clock tree cells 8g, 8h, 8i. Each of the branch clock paths terminates at the clock input of a respective flop 18, 20. The Q output of the first flop 18 is connected via critical path logic 22 to the D input of the second flop 20.

It will readily be appreciated that these components are illustrative only, and that in a real integrated circuit the clock distribution network and the layout of flops and logic will be considerably more complex. For example, the number of flops could be around 50,000, with around 4,000 clock tree cells. Thus, while it may appear simple to apply active use of clock skewing to optimize operation of the flops in FIG. 1, in real life the sheer number of flops and clock tree cells, together with the complexity of the clock distribution network, make such a task very difficult. In FIG. 1, it can be seen that the clock tree path 14 supplies the clock CLK to the start point of the logic path, the start point being the flop 18. Conversely, the clock tree path 16 supplies the clock CLK to the end point of the logic path, being the second flop 20. Data is transferred from the queue output of the first flop 18 via the critical path logic 22 to the D input of the second flop 20. The delay in the clock tree paths 14, 16 can be adjusted by adjusting the drive strength of the clock tree cells 8d . . . 8i. By increasing the drive strength of the clock tree cells, the delay in a particular clock tree path can be decreased. Conversely, by reducing the drive strength of the clock tree cells, the delay can be increased.

In order to make useful use of clock skew, normally the aim is to experiment with increasing the drive strength of the clock tree cells in the clock tree path 14 to speed up the clock going to the start point of the logic path, and decreasing the drive strength to slow down the clock in the clock tree path 16 going to the end point of the logic path. In this way, it is possible to speed up the launch of data at the beginning of the critical logic path and simultaneously slow down the clock to receive the data at the end point of a logical path, thereby decreasing the effect of the critical logic path on the overall timing.

Figure 2:
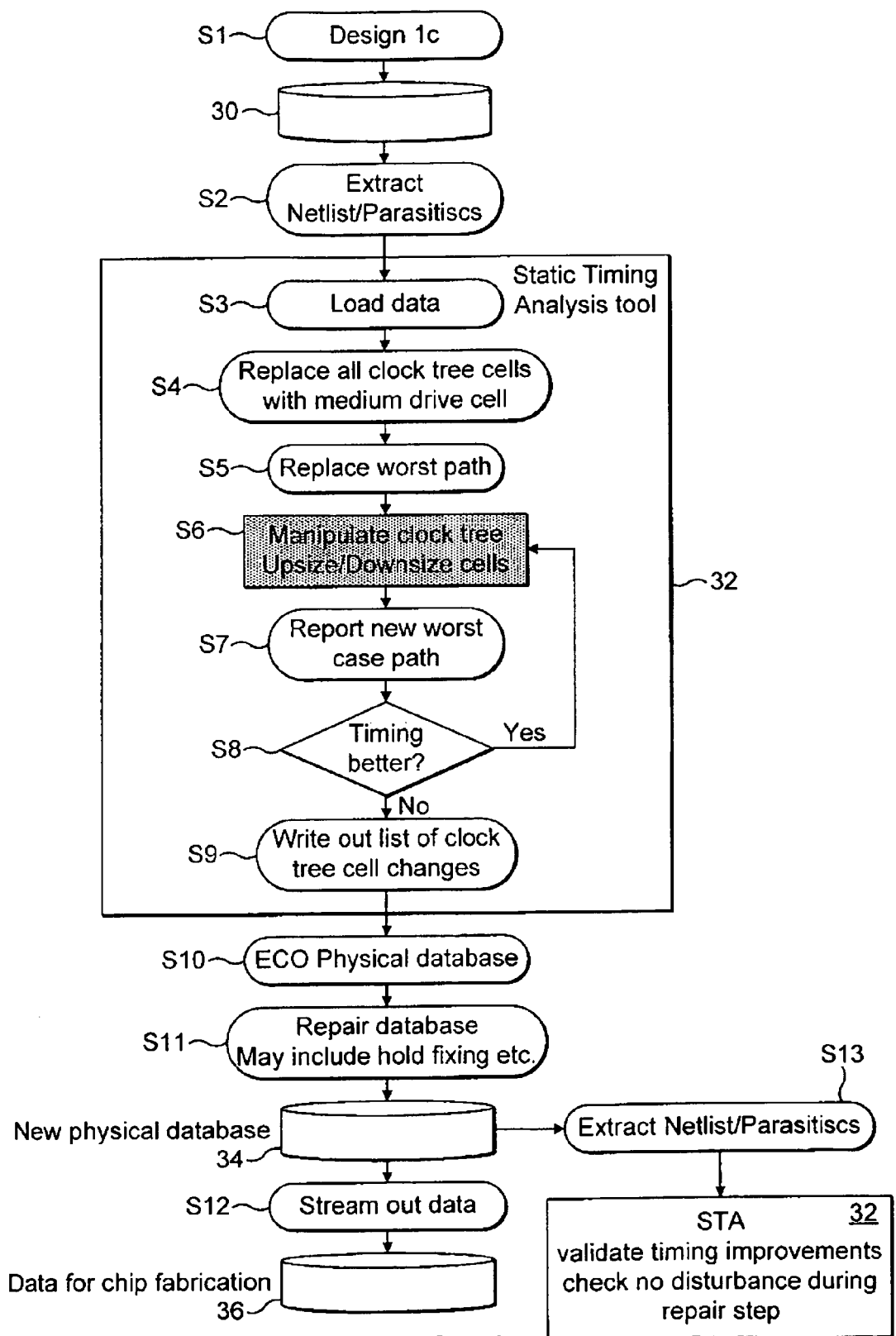
FIG. 2 is a flow chart illustrating a method according to one embodiment of the present invention.

The drive strength of clock tree cells can be adjusted by using cells of differing sizes from a digital cell library. A difficulty that has arisen in the past, is that, if a design is implemented with certain optimized clock tree cells for overall performance, and then an attempt is made to make active use of clock skew which would involve upsizing clock tree cells, this can impact the overall layout of the design, and effectively mean that another design iteration is required. A method which avoids this problem will now be described with reference to FIG. 2.

In the first step of the method, S1, an integrated circuit is designed in a conventional way, apart from the fact that all clock tree cells are included with the maximum allowed drive strength in the cell library, and hence the largest allowed clock tree cell in the cell library. Data from this design is contained in a physical design database 30. At step S2, a net-list comprising cell types/sizes and their connectivity and parasitic is extracted from the physical design database 30 and supplied to a static timing analysis tool 32. At step S3, the net-list and parasitic data is loaded into the timing analysis tool. At step S4, all clock tree cells are replaced with a medium drive strength cell. The timing analysis tool reports at step S5 the worst case timing path in the integrated circuit and at step S6 a manipulation process is executed to manipulate the clock distribution network to upsize and/or downsize cells to adjust the timing. The manipulation process is achieved within the static timing analysis environment using a tcl script, an example of which is appended as Appendix A. The manipulation process works its way through the clock distribution network, adjusting cell sizes dependent on branch nodes, start points, end points and timing parameters. After the manipulation process at S6 has been completed, the new worst case path is reported at step S7 and an assessment is made at step S8 as to whether or not there has been an improvement in timing. If there has, the manipulation process S6 is run again. If there has not, at step S9 a list of clock tree cell changes is written out and output from the static timing analysis tool 32. At step S10, this list is supplied as an ECO (Engineering Change Order) to the physical database. At step S11, the database is repaired following the ECO and the repaired data become a new physical database 34. At step S12, stream out data is supplied from the new physical database to a memory 36 holding data for chip fabrication. Additionally, at step S13 a net-list and parasitic can be extracted from the new physical database 34 to be returned to the static timing analysis tool 32 to validate timing improvements and check that no disturbances occurred in the repair step.

Figure 3:
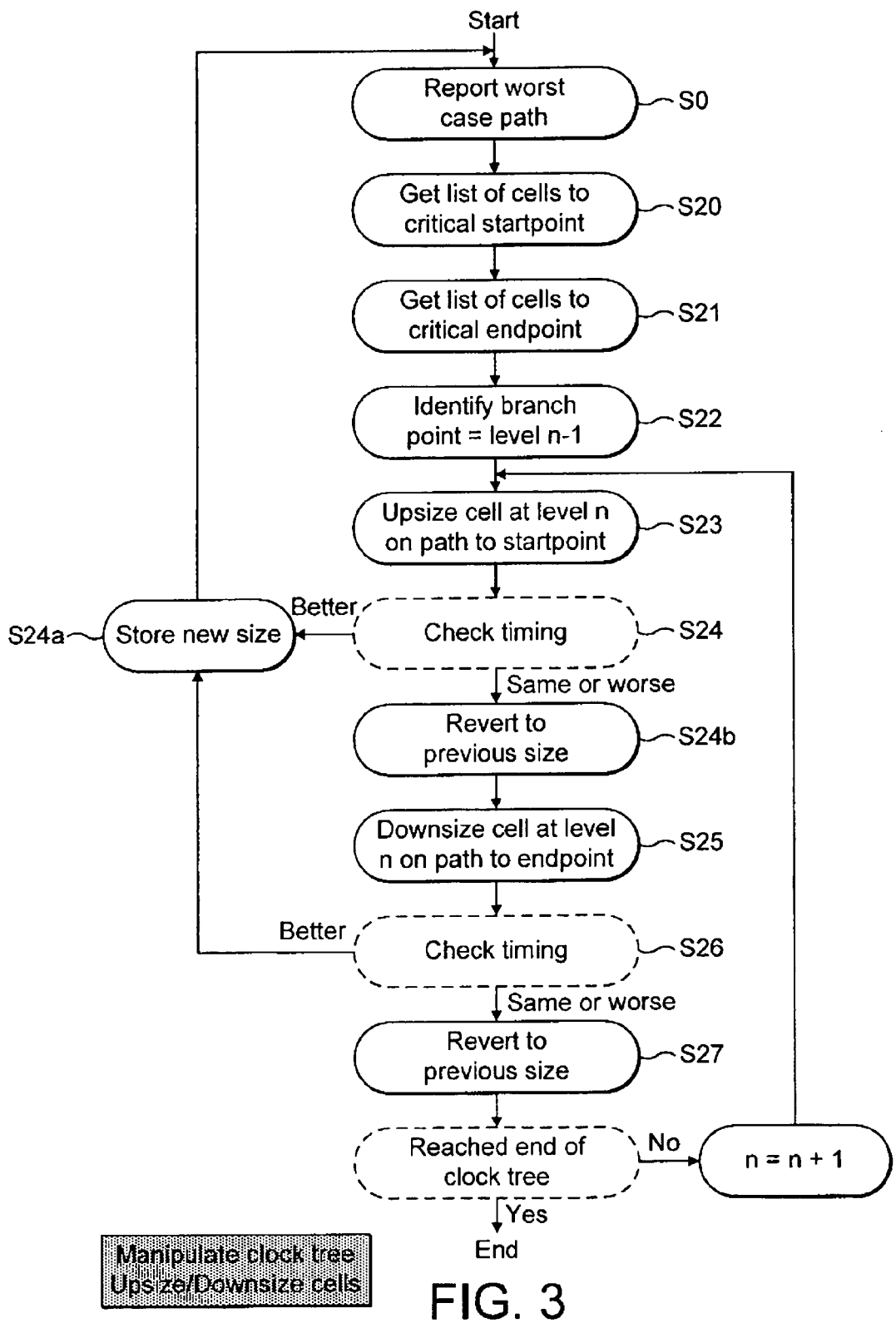
FIG. 3 is a flow chart illustrating the clock tree cell manipulation process.

FIG. 3 shows in more detail the steps of the manipulation process S6. The worst case path is reported at step S0. At step S20 the process obtains a list of clock tree cells from the clock node 4 to the start point 18 of the worst case critical path. Assume for this description that the worst case path is that represented by logic 22 in FIG. 1. Thus, the clock tree cells identified in this case would be 8a to 8f. At step S21 a list is obtained of clock tree cells to the endpoint of a critical path. In this case, the cells would be 8a to 8i.

At step S22, the branch point or divergence point 12 is identified by skipping along the common part of the clock tree to compare common cells in the list obtained in steps S20 and S21. This identifies the branch point at the first divergent level (n=1) of the clock tree. At step S23, the cell at the current divergent level between the branch point and the start point of the path (e.g. One of cells 8d to 8f) is then upsized. At step S24 the timing is checked. If there is an improvement, the new size is stored at step S24a and the process loops back to step S0. If there is no improvement, the process moves to step S24b which reverts the cell to its previous size. Next, at step S25, the equivalent cell (e.g. One of cells 8g to 8i) on the divergent part of the clock path to the end point 20 is downsized. The timing is checked at step S26, and again if there is an improvement, the process stores the new size at step S24a and goes back to step S0. If there is no improvement, the process reverts the cell to its previous size at step S27. Step S28 checks to see if the process has reached the final level of the clock tree. If so, the process ends. If not, it loops back to step S23 for the next level (n+1).

In the above-described method, since the largest size of clock tree cells is used for initial placement, after the global downsizing of clock tree cells to a medium or intermediate size, there is space to re-upsize clock tree cells if necessary. The upsizing/downsizing can cause some repairs needed to the layout to reconnect the pins on the clock tree cells, but this could be easily fixed by physical design tools and does not disturb routing (and by implication timing) to any significant extent.

The same technique may be implemented using multi-threshold voltage (Vt) versions of the same drive clock tree cells if mixing Vt cells in one clock tree is allowed in the design flow. The Vt options affect cell performance by adjusting the transistor switching threshold rather than transistor size. Lower Vt cells are faster and more leaky (larger static current) but have the same physical footprint as their high Vt equivalent. In this case, the initial global downsizing step can be omitted and no repair to the routing is required.

Figure 4:
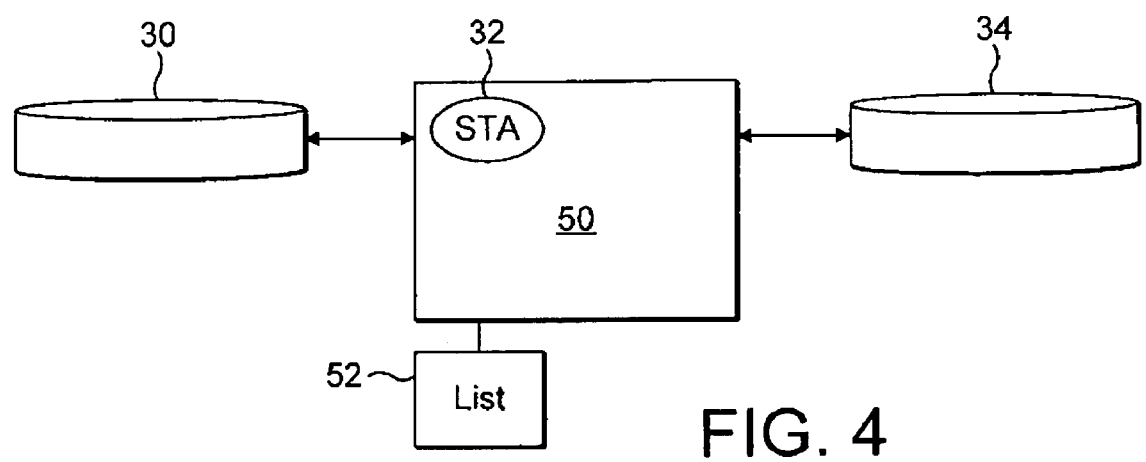
FIG. 4 is a schematic block diagram illustrating a computer system for implementing one embodiment of the invention.

FIG. 4 is a schematic block diagram of a computer system for implementing an embodiment of the invention. A processor 50 is arranged to execute various tools and process flows. The processor 50 is connected to the database 30 and is connected also to a storage device 52 which holds a file providing the list of clock tree cell changes produced by step S9 of the static timing analysis tool. It will be clear that the static timing analysis tool 32 is one of the tools which can be executed by the processor 50. The processor 50 is also connected to the physical database 34 which holds the final information for streaming out for chip fabrication.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of designing a clock distribution network in an integrated circuit, comprising:
   creating a clock distribution network, a drive strength for all cells in the clock distribution network having a maximum allowed drive strength for cells in a cell library;
   supplying parameters of the clock distribution network to a timing analysis tool;
   by at least one processor in a computer executing the timing analysis tool, reducing the drive strength of all cells in the clock distribution network to an intermediate drive strength and analyzing the timing of the clock distribution network in an iterative process including manipulating a drive strength of at least one cell in the clock distribution network and assessing whether there is an improvement in the timing, wherein the iterative process continues until there is no improvement in the timing; and
   outputting a list of cells for which the drive strength was changed.

2. The method according to claim 1, wherein the iterative process is carried out on a worst case path of the clock distribution network.

3. The method according to claim 1, wherein reducing the drive strength of the cells to an intermediate drive strength is performed prior to analyzing the timing of the clock distribution network.

4. The method according to claim 3, wherein manipulating the drive strength of the at least one cell comprises upsizing the cell to one of a plurality of drive strengths between the intermediate drive strength and the maximum drive strength.

5. The method according to claim 4, wherein the maximum and/or minimum drive strengths are determined by sizes of cells in a cell library.

6. The method according to claim 3, wherein manipulating the drive strength of the at least one cell comprises downsizing the drive strength to one of a plurality of drive strengths between the intermediate drive strength and a minimum drive strength.

7. The method according to claim 1, wherein the drive strengths are determined by threshold voltages of cells in a cell library.

8. The method according to claim 1, further comprising transferring the list of cells to a physical database for use in fabricating an integrated circuit.

9. A timing analysis tool for analyzing a clock distribution network of an integrated circuit, the tool comprising program code which when executed in a computer carries out:
   loading data characterizing the clock distribution network, a drive strength for all cells in the clock distribution network having a maximum allowed drive strength for cells in a cell library;
   reducing the drive strength of all cells in the clock distribution network to an intermediate drive strength;
   analyzing the timing of the clock distribution network in an iterative process including manipulating a drive strength of at least one cell in a clock distribution network and assessing whether there is an improvement in the timing, wherein the iterative process continues until there is no improvement in the timing; and
   outputting a list of cells for which the drive strength was changed.

10. The method according to claim 1, wherein creating a clock distribution network comprises establishing routing data of the clock distribution network in a physical design database.

11. The method according to claim 1 further manufacturing an integrated circuit,
   the method of designing a clock distribution network according to claim 1; and
   using the list of cells output from the timing analysis tool to manufacture the integrated circuit.

12. The integrated circuit manufactured by the method according to claim 11.

13. The method of claim 1, wherein the method further comprises, in the timing analysis tool:
   when manipulating the drive strength of a cell of the at least one cell results in no improvement in the timing, reverting the drive strength of the cell to its previous drive strength.

14. An integrated circuit comprising:
   a clock distribution network having a common clock path extending from a clock node to a branch node;
   a first branch path extending from the branch node to a start point of a logical circuit path;
   a second branch path extending from the branch node to an end point of the logical circuit path, wherein the first branch path includes cells of a greater drive strength than cells of the second branch path, wherein the drive strengths of the cells have been selected by execution of a timing analysis tool according to claim 9.

15. The timing analysis tool of claim 9, wherein the program code, when executed in the computer, further carries out:
   when manipulating the drive strength of a cell of the at least one cell results in no improvement in the timing, reverting the drive strength of the cell to its previous drive strength.

16. A computer system for designing a clock distribution network in an integrated circuit, the computer system comprising:
   a database holding data defining a clock distribution network, a drive strength for all cells in the clock distribution network having a maximum allowed drive strength for cells in a cell library;
   a processor adapted to execute a timing analysis tool which, when executed, reduces the drive strength of all cells in the clock distribution network to an intermediate drive strength and analyses the timing of the clock distribution network in an iterative process including manipulating a drive strength of at least one cell in the clock distribution network and assessing whether there is an improvement in the timing, the iterative process continuing until there is no improvement in the timing; and
   a storage device for holding a list of cells output from the timing analysis tool for which the drive strength was changed.

17. The computer system of claim 16, wherein the processor is further adapted to:
when manipulating the drive strength of a cell of the at least one cell results in no improvement in the timing, revert the drive strength of the cell to its previous drive strength.

18. A method of designing a clock distribution network in an integrated circuit, comprising:
creating a clock distribution network, a drive strength for all cells in the clock distribution network having a maximum allowed drive strength for cells in a cell library;
supplying parameters of the clock distribution network to a timing analysis tool;
reducing the drive strength of the cells to an intermediate drive strength prior to analyzing the timing of the clock distribution network;
by at least one processor in a computer executing the timing analysis tool, analyzing the timing of the clock distribution network in an iterative process including manipulating a drive strength of at least one cell in the clock distribution network and assessing whether there is an improvement in the timing, wherein the iterative process continues until there is no improvement in the timing; and
outputting a list of cells for which the drive strength was changed.

19. The method according to claim 18, wherein the iterative process is carried out on a worst case path of the clock distribution network.

20. The method according to claim 18, wherein manipulating the drive strength of the at least one cell comprises upsizing the cell to one of a plurality of drive strengths between the intermediate drive strength and the maximum drive strength.

21. The method according to claim 18, wherein manipulating the drive strength of the at least one cell comprises downsizing the drive strength to one of a plurality of drive strengths between the intermediate drive strength and a minimum drive strength.

22. The method according to claim 21, wherein the minimum drive strength is determined by sizes of the cells in the cell library.

23. The method according to claim 18, wherein the drive strengths are determined by threshold voltages of cells in the cell library.

24. The method according to claim 18, further comprising transferring the list of cells to a physical database for use in fabricating an integrated circuit.

25. The method according to claim 18, wherein creating a clock distribution network comprises establishing routing data of the clock distribution network in a physical design database.

26. The method of claim 18, wherein the method further comprises, in the timing analysis tool:
when manipulating the drive strength of the a cell of the at least one cell results in no improvement in the timing, reverting the drive strength of the cell to its previous drive strength.

* * * * *